United States Patent [19]

Tani

[11] Patent Number: 5,452,655
[45] Date of Patent: Sep. 26, 1995

[54] SCREEN PRINTING APPARATUS FOR PRINTING OF VISCOUS MATERIAL

[75] Inventor: Okie Tani, Tokyo, Japan

[73] Assignee: Tani Denkikogyo Co., Ltd., Tokyo, Japan

[21] Appl. No.: 243,809

[22] Filed: May 17, 1994

[30] Foreign Application Priority Data

May 19, 1993 [JP] Japan ................... 5-153064

[51] Int. Cl.⁶ ................................. B41L 13/02
[52] U.S. Cl. .................. 101/123; 101/114; 101/126; 101/128; 101/129; 101/127
[58] Field of Search .................. 101/114–129; 29/829

[56] References Cited

U.S. PATENT DOCUMENTS

| | | |
|---|---|---|
| 2,207,102 | 1/1936 | Hommel . |
| 4,070,964 | 1/1978 | Vertegaal ................ 101/120 |
| 4,552,778 | 11/1985 | Zimmer ................. 427/445 |
| 4,622,239 | 11/1986 | Schoenthaler . |
| 4,729,306 | 3/1988 | Bubley .................. 101/114 |
| 5,145,691 | 9/1992 | Kawakami et al. ........ 425/110 |
| 5,287,806 | 2/1994 | Nanzai ................. 101/123 |

FOREIGN PATENT DOCUMENTS 1-55597  11/1989  Japan .
4-242993  8/1992  Japan .

Primary Examiner—Edgar S. Burr
Assistant Examiner—Lynn D. Hendrickson
Attorney, Agent, or Firm—McGlew and Tutttle

[57] ABSTRACT

An apparatus for printing a viscous material onto a surface of a board through the medium of a screen having openings therein. The apparatus comprises a viscous material dispenser (S) of the type having a box-like housing (A) in which a chamber (5) for containing the material and a slit-like bottom aperture (3) communicating therewith are provided. A pair of blades (2A, 2B) depend from the housing (A) on opposite sides of the bottom aperture (3). A rear wall (8) of the housing (A) comprises a fixed upper wall section (8A) and a lower flap wall section (8B) swingably and slidably connected thereto and depending therefrom. The lower flap wall section (8B) defines the rear side of the bottom aperture (3). One of said blades which serves as a squeegee blade is fixed to the flap wall section. The flap wall section (8B) is connected to a pair of manually operable height-adjustable devices (22) respectively mounted on said housing and for adjusting the height of the flap wall section (8B) having the squeegee blade (2B) so that by adjusting said height by means of said devices the contacting pressure of the lower end of said blade (2B) to be applied against the upper surface of said screen (1) can be adjusted as desired. Also, the flap wall section (8B) is operatively engaged with a pair of actuating means (B) respectively mounted on said housing and for closing said aperture (8) when the dispenser is in a non-printing position and for opening it to supply a predetermined amount of the material contained in said chamber (5) onto the screen (1) through said aperture when the dispenser is in a printing position.

10 Claims, 10 Drawing Sheets

SCREEN PRINTING APPARATUS FOR PRINTING OF VISCOUS MATERIAL

BACKGROUND OF THE INVENTION

1. Field of the Invention

The present invention relates generally to an apparatus for dispensing a viscous material onto a surface through a screen having a plurality of openings therein, and more particularly to a screen printing apparatus for printing solder paste onto a surface of a printed circuit board through the screen that is used in producing surface mount technology circuit boards suitable for use in high technology products.

2. Description of the Prior Art

A screen printing apparatus is known which has a spatula-like flexible squeegee which is arranged to be displaced back and forth along a pair of guide rails and is arranged to be raised and lowered relative to the guide rails. This printing apparatus is adapted to be in pressure contact with an upper surface of the screen when it is lowered and placed into a lower position where solder paste is printed onto a surface of a printed circuit board through the medium of the screen. This type of screen printing apparatus is disclosed in the Japanese Patent Gazette No. 1-55597 published on 27th Nov., 1989. In this type of apparatus, a considerable amount of solder paste is manually supplied onto the screen prior to operating the apparatus and the solder paste supplied onto the screen in such a way is printed on the surface of the circuit board by reciprocating the squeegee, while its lower end is pressed against the screen to introduce the solder paste into openings of the screen.

Major disadvantages of this type of screen printing apparatus are that as a considerable amount of solder paste placed on the screen is kept exposed to the air until the apparatus is put into operation, it tends to be solidified due to evaporation of flux contained therein and/or to be oxidized as it contains oxidizable components, such as lead. As the printing of solder paste is performed by reciprocating the squeegee, the solder paste tends to be excessively printed on a surface of the circuit board. As a result, printed films or deposits tend to be blurred on the surface of the circuit board and, in addition, a uniform printing effect cannot be obtained in every printing cycle. It is difficult to prevent the solder paste from acquiring of such changes as solidification, oxidation, etc., even if it is frequently kneaded on the screen with manual labour during the period when the apparatus is not in operation. To use such a solidified and/or oxidized solder paste brings about undesirable printing effect. For this reason, it must be removed from the screen and replaced with new solder paste. This means that a considerable amount of solder paste becomes a useless waste to be abandoned. In addition, replacement of solder paste not only requires the manual labour, but also requires printing operation be stopped for a certain period of time. This results in an economic loss and worker exposure to lead which is a health concern.

Another screen printing apparatus is known which comprises a viscous material automatic supply dispenser of the type having a housing of a closed box type in which a chamber for containing the material and a slit-like bottom aperture communicating therewith, having a leading side defined by a front wall and a trailing side defined by a rear wall and being arranged to be normally closed and to be kept open to automatically supply a predetermined amount of the material onto a surface of a board during printing. This type of screen printing apparatus is disclosed in U.S. Pat. No. 2,027,102 and in the Japanese patent application No. H2-419135 published in 1992. In this type of known apparatus, the dispenser is provided with a flexible or pliable rear wall which serves as a squeegee to force the material supplied by the dispenser onto an upper surface of a screen into openings in the screen. Another screen printing apparatus which is similar to this type of known apparatus and in which a slit-like bottom aperture in a housing is not arranged to be closed and opened is also known. This type of apparatus is disclosed in U.S. Pat. No. 4,622,239. The apparatus disclosed in this patent is provided with a pair of flexible blades as squeegee blades which are secured to, and depend from a housing on opposite sides of the bottom aperture to contact a screen.

A common feature of these known apparatuses of the type having such a viscous material automatic supply dispenser is that one or two squeegees employed by the dispenser are formed of a urethane rubber or the like. This feature tends to bring about disadvantages when the dispenser is used for screen printing of solder paste onto a surface of a printed circuit board, as will be described later.

Another common feature of these known apparatuses of the type mentioned above is that the dispenser lacks means for adjusting the contacting pressure of a squeegee to be applied against the upper surface of the screen. Lack of such means also brings about disadvantages, as will also be described.

FIG. 13(a) shows the state in which a flexible squeegee N employed by a conventional screen printing apparatus is in pressure contact with a metal screen 1. As shown, the lower end of the squeegee projects partially by deformation into an opening 1A in the screen. As a result, as shown in FIG. 13(b), printed solder paste 4 on a metalized area of a printed circuit board P is deformed into a concave, so that uniformity in the printed paste thickness cannot be obtained.

When printing solder paste 4 which normally has a high viscosity with the flexible squeegee N, the squeegee will experience high shear forces, causing the paste to separate into the constituent components (e.g., solder particles and a suspending viscous flux) and a thin film of flux is formed on the screen 1. The flux film left on the screen makes residue of the paste which is detrimental to high quality printing of solder paste onto the printed circuit board P.

The amount of projection of the flexible squeegee N into an opening 1A is larger as the area of each opening is larger, preventing high quality printing.

In the screen printing, printing is repeatedly performed, so that when the contacting pressure of squeegee applied against a screen is too strong, the screen is caused to be damaged by abrasion. If the viscous material to be printed is solder paste containing solder particles, abrasive friction between the screen and the squeegee will be increased, because the particles are forced to be pushed ahead under pressure. Conversely, if and when said contacting pressure is weak, then some of the flux and some of the solder particles will pass under the squeegee and will be left as solder paste residue. In addition it will be impossible for the squeegee to introduce a sufficient amount of solder paste into each of the openings in the screen, preventing proper printing. Moreover, the printed solder paste, when depleted of flux, tends to remain in the screen openings and causes the problem of clogging of the openings. It is impossible for the conventional dispensers to adjust the contacting pressure of the squeegee or squeegees to be applied against the screen as occasion demands.

SUMMARY AND OBJECTS OF THE INVENTION

The present invention is intended to eliminate the disadvantages or drawbacks indicated with the prior art as described above and to provide an improved apparatus for printing a viscous material, such as solder paste onto a surface of a board, such as a printed circuit board through the medium of a screen having openings therein which is capable of performing a precise and high quality screen printing and which is particularly suited for use in mounting surface-mounted components, such as semi-conductor chips, resistors and capacitors etc., on the printed circuit boards.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DETAILED DESCRIPTION OF THE PREFERRED EMBODIMENT

Figure 1:
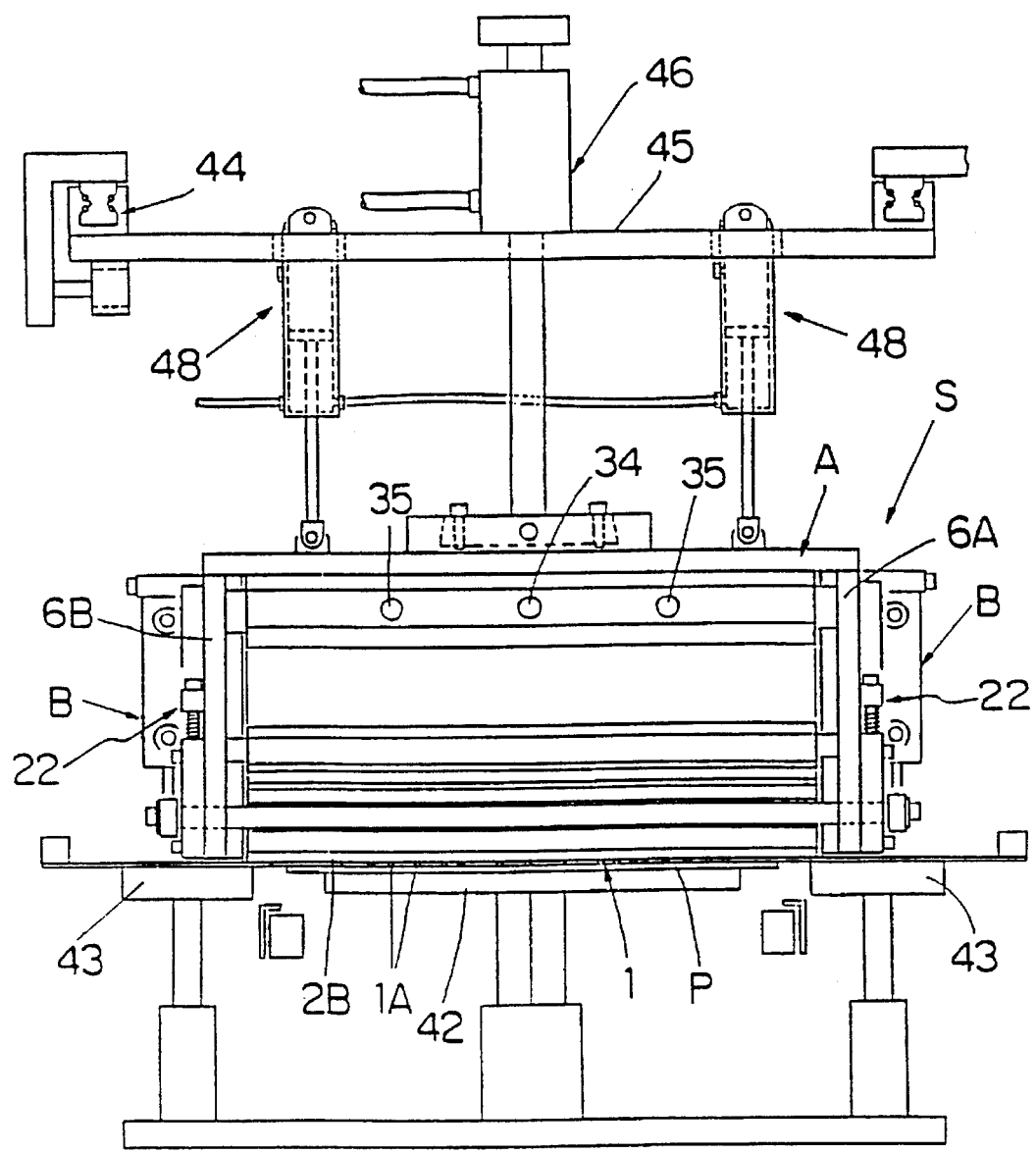
FIG. 1 is a rear view of one embodiment of the present invention.

Referring to FIGS. 1, 2, 3, 10 and 12, there is shown a screen printing apparatus as one embodiment of the present invention. The apparatus comprises a solder paste supply dispenser S which is arranged to be moved along a pair of guide rails back and forth and to be raised and lowered relative to the guide rails. The dispenser S comprises a box-like housing A having a chamber 5 for containing solder paste 4 to be printed onto a surface of a printed circuit board P through a screen 1 formed of a metal plate, such as a stainless steel plate and a slit-like bottom aperture 3 formed in the bottom of the housing A and communicating with the chamber 5. A pair of relatively thin metal blades 2A, 2B depend from the bottom of the housing A on opposite sides of the bottom aperture 3 to contact an upper surface of the screen 1 during printing. The screen 1 has a plurality of openings 1A therein and is positioned on the circuit board P which is placed on a printing table 42 of the apparatus.

The housing A includes a pair of side walls substantially parallel to, and spaced from, each other in a direction of travel of the dispenser S and a front wall 7 fixedly secured to inner surfaces of forward portions of the side walls 6A, 6B and extending perpendicular thereto. The front wall 7 extends rearwardly and downwardly and has at the lowest portion thereof a bottom wall 7A with a rearwardly and downwardly directed portion. The housing A also includes a rear wall 8 which comprises an upper wall section 8A fixedly secured to inner sides of rearward portions of the side walls 6A, 6B and extending perpendicular thereto and a lower flap wall section 8B having a rearwardly and downwardly directed lower portion. As may be seen from FIG. 12, in the illustrated embodiment, the metal blade 2A as a leading blade is fixedly secured to an inner surface of rearwardly and downwardly directed portion of the bottom wall 7A of said front wall 7 and the metal blade 2B as a trailing blade serving as a squeegee blade is secured to the lower portion of said lower flap wall section 8B by clamp means 8B'.

The lower flap wall section 8B is swingably and slidably connected to and depending from the fixed upper wall section 8A so that it can be swung toward and away from the front wall 7 to close and open the bottom aperture 3 which is formed between the bottom wall 7A from which the leading blade 2A depends and the lower portion of said lower flap wall section 8B from which the squeegee blade 2B depends and, at the same time, it can be generally vertically moved within a predetermined range to adjust its height.

Figure 5:
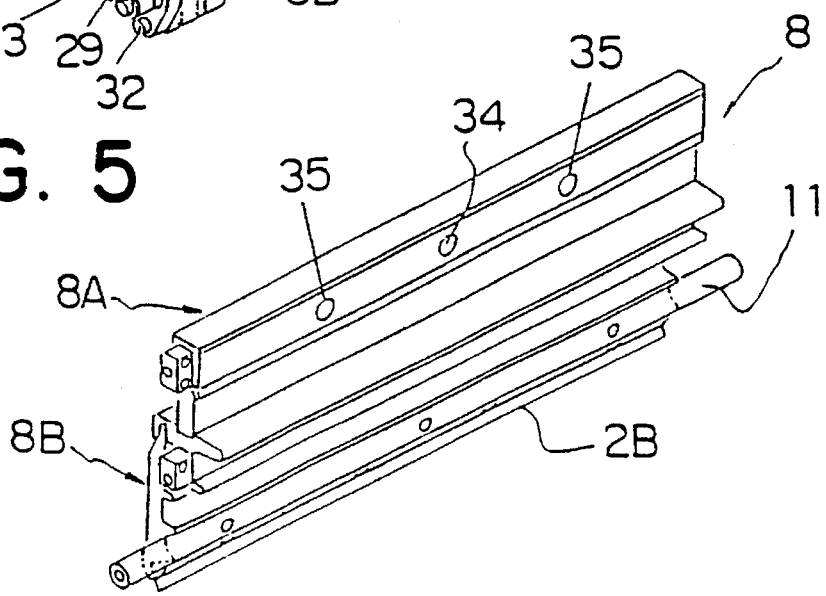
FIG. 5 is a perspective view of a rear wall of the dispenser.
Figure 6:
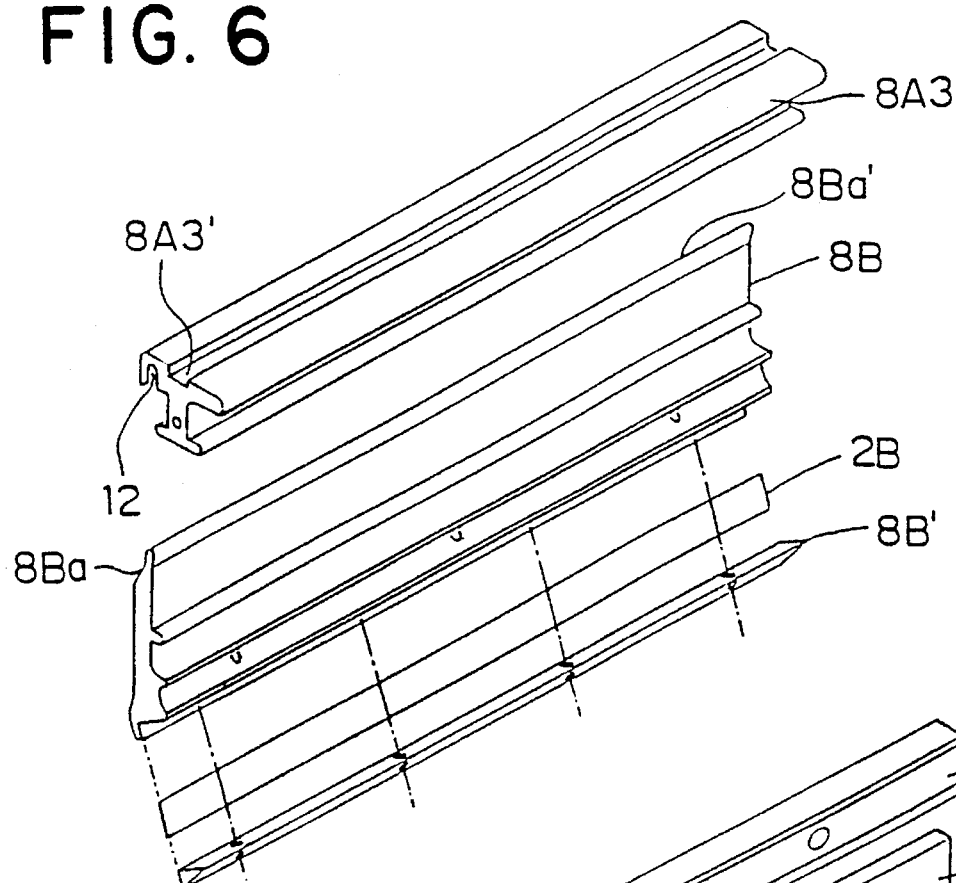
FIG. 6 is an exploded perspective view of a part of the rear wall.
Figure 7:
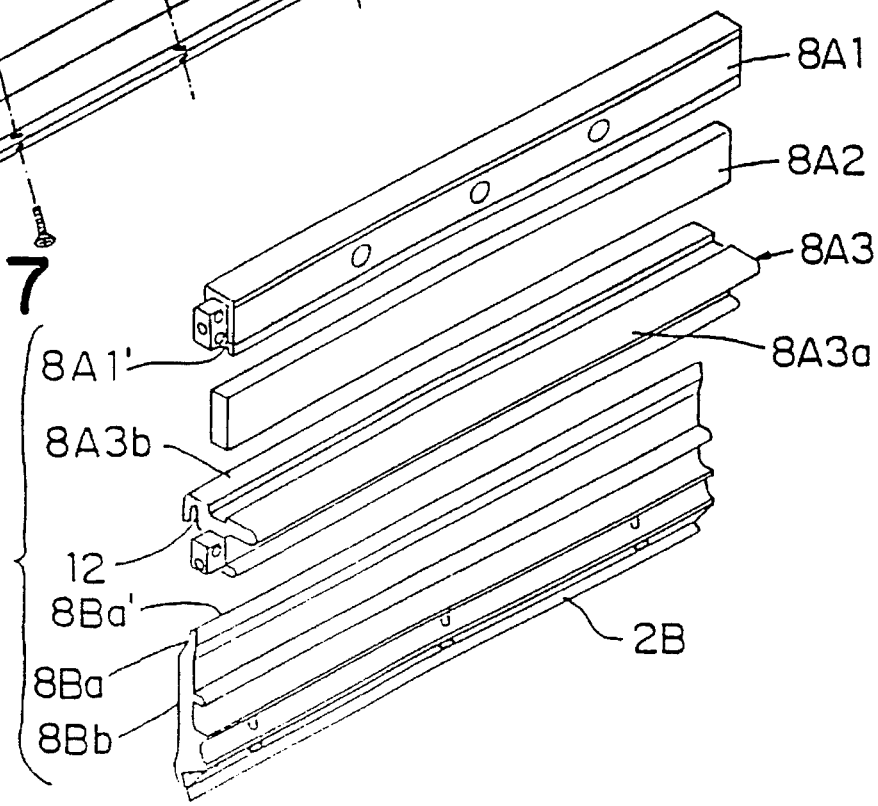
FIG. 7 is an exploded perspective view of the rear wall.

In the illustrated embodiment, the upper wall section 8A is, as shown in FIGS. 5 through 7, composed of an upper wall member 8A1, an intermediate wall member 8A2 dismantably secured thereto and a lower wall member 8A3 dismantably secured thereto. As shown in FIG. 7, the intermediate wall member 8A2 is an elongated plate having a rectangular cross-section shape and serving as a connecting wall for the upper wall member 8A1 and the lower wall member 8A3. These wall members 8A1 and 8A3 are connected by the intermediate wall member 8A2 in such a way that an upper portion of the intermediate wall member 8A2 is frictionally fitted into a groove 8A1' formed in the bottom of the upper wall member 8A1 along a longitudinal axis thereof and a lower portion of the intermediate wall member 8A2 is also frictionally fitted into a groove 8A3' formed in the top portion of the lower wall member 8A3 along a longitudinal axis thereof.

As may be seen from FIGS. 5 through 7 and 10, the lower flap wall section 8B is a shaped wall block having a relatively thick body portion 8Bb and a relatively thin upper portion 8Ba with a rounded portion 8Ba' which extends along a longitudinal axis of the flap wall section 8B. On the other hand, the lower wall member 8A3 is a generally T-shaped wall block having a pair of flanges 8A3a, 8A3b projecting in opposite horizontal directions. The forwardly projecting flange 8A3B is provided with a substantially inverted U-shaped groove 12 which extends along the groove 8A3' and which can slidably receive the rounded portion 8Ba' of the lower flap wall section 8B. Thus, as the flap wall section 8B is connected to the lower wall member 8A3 of the upper wall section 8A by fitting the rounded portion 8Ba' into the inverted U-shaped groove 12, the flap wall section 8B depending therefrom can be swung toward and away from the front wall 7.

In the illustrated embodiment, the lower flap wall section 8B is operatively engaged with a pair of actuating means B mounted on the side walls 6A, 6B of housing A and for closing the aperture 3 when the dispenser S is in a non-printing position and for opening it to supply a predetermined amount of solder paste 4 contained in the chamber 5 onto the screen 1 through the aperture 3 when the dispenser S is in a printing position. Each of the actuating means B comprises a pneumatic actuator 20 mounted on the outer side of each of the side walls 6a, 6B at a forward portion thereof and a link mechanism 21 which drivingly connects the actuator 20 to the lower flap wall section 8B through the medium of a transversely extending cylindrical member 11 to which a recessed rear portion provided on the rear side of the flap wall section 8B is secured by fasteners. The cylindrical member 11 is movably supported at its opposite end portions 11A by forwardly and downwardly extending slots 10A, 10B respectively formed in lower portions of the side walls 6a, 6B of the housing A. The link mechanism 21 comprises a bell crank 21A pivotally mounted on each side wall 6A, 6B by means of a pin 21' and pivotally connected at one end to a piston rod 20A of the air cylinder 20 and a link arm 21B one end of which is pivotally connected to the other end of the bell crank 21A and the other end is pivoted to each of the opposite ends of the cylindrical member 11 that projects outwardly of the side walls 6A, 6B through the slots 10A, 10B.

Figure 2:
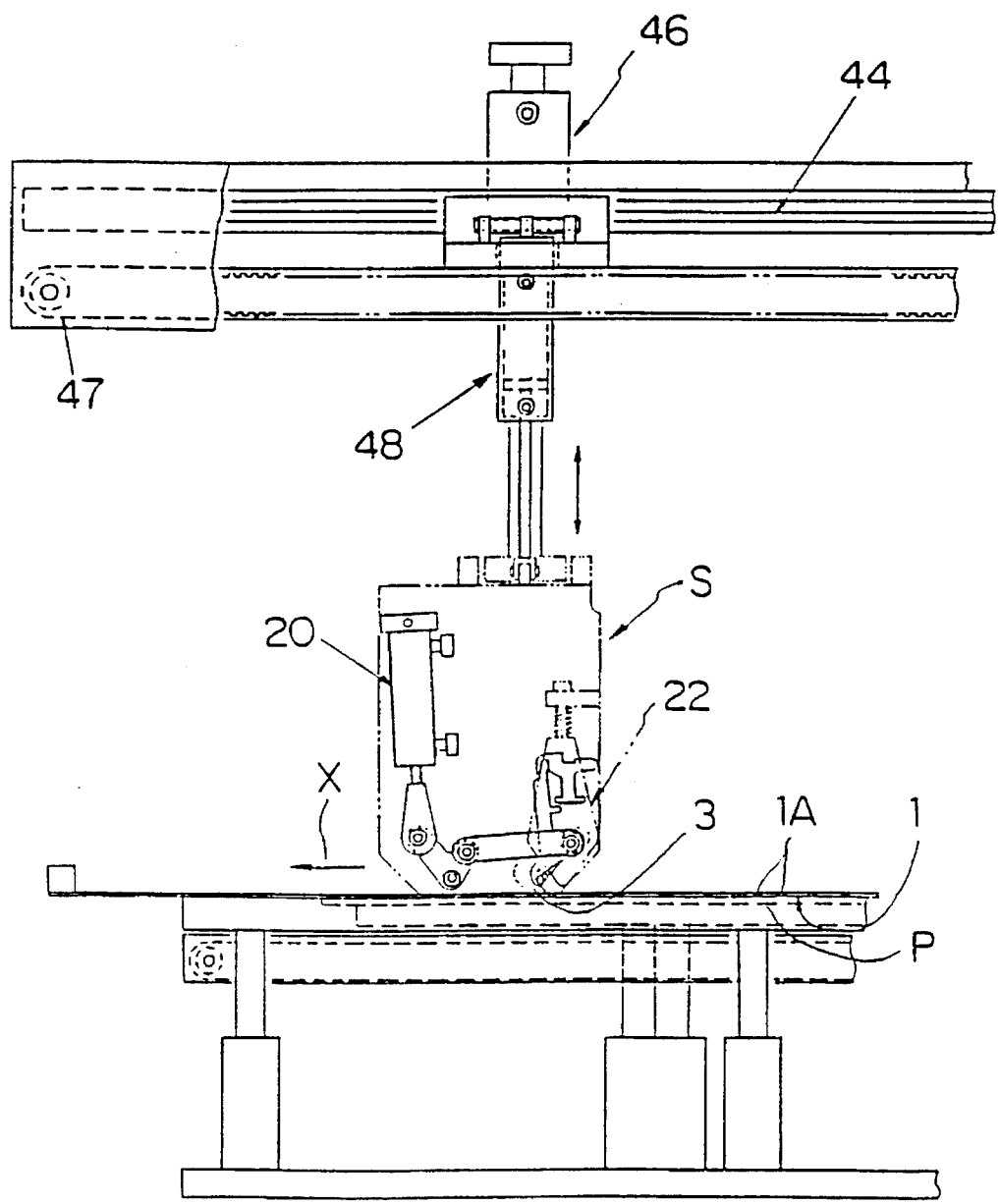
FIG. 2 is a side view of the embodiment, showing the state in which the dispenser is performing a screen printing operation.
Figure 3:
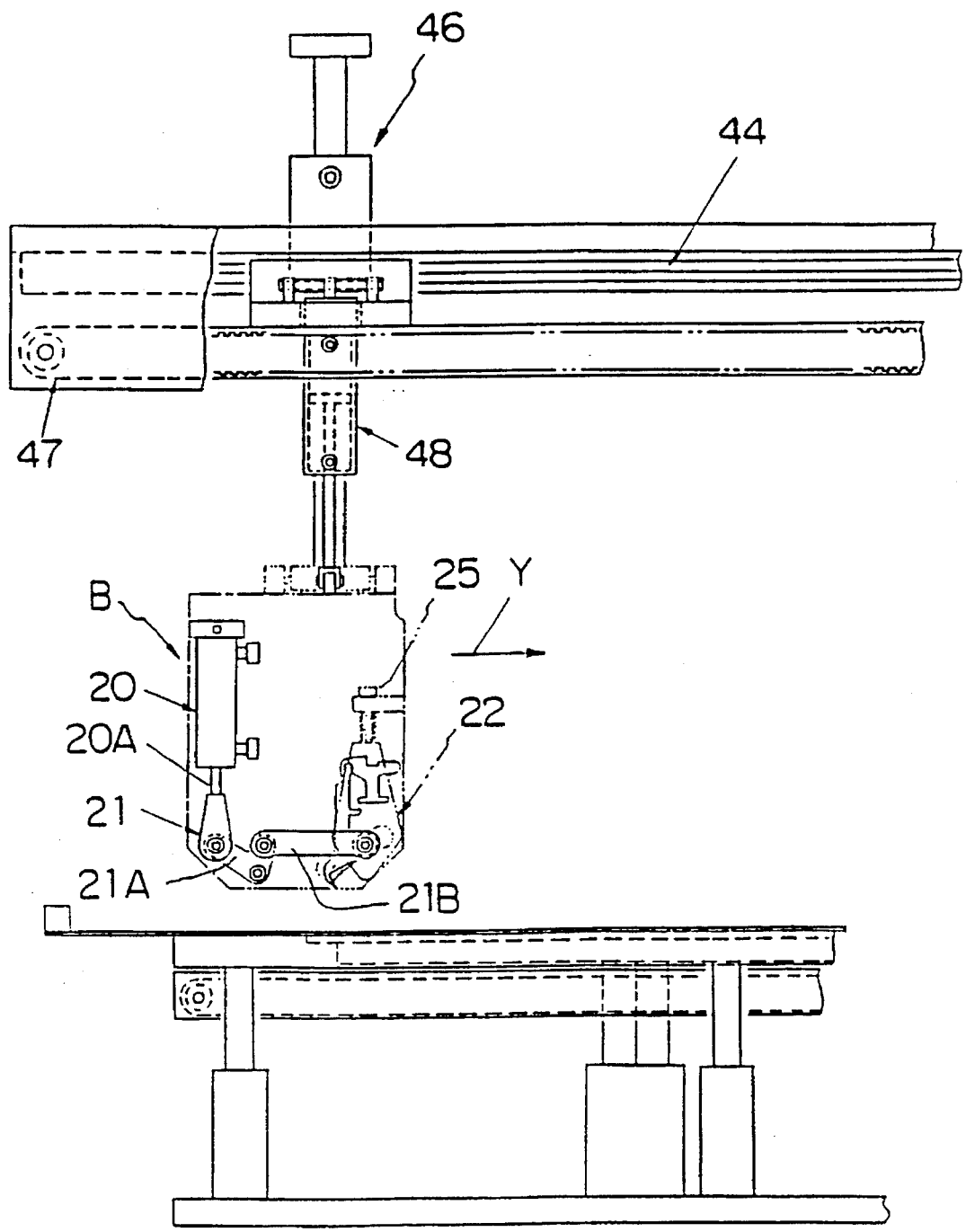
FIG. 3 is a side view of the embodiment, showing the state in which the dispenser is raised after it has finished screen printing.

Accordingly, with the actuating mechanism mentioned above, as the bell crank 21A is pulled by the piston rod 20A when the dispenser S is at rest and the bottom aperture 3 is closed as shown in FIG. 3, the cylindrical member 11 is rearwardly pushed by the link arm 21B, thereby causing the lower flap wall section 8B to be swung away from the front wall 7 to open the bottom aperture 3, as shown in FIG. 2. Conversely, as the bell crank 21A is pushed by piston rod 20A when the aperture 3 is open, the cylindrical member 11 is pulled by link arm 21B, thereby causing the flap wall section 8B to be swung toward the front wall 7 to close the bottom aperture 3.

Figure 4:
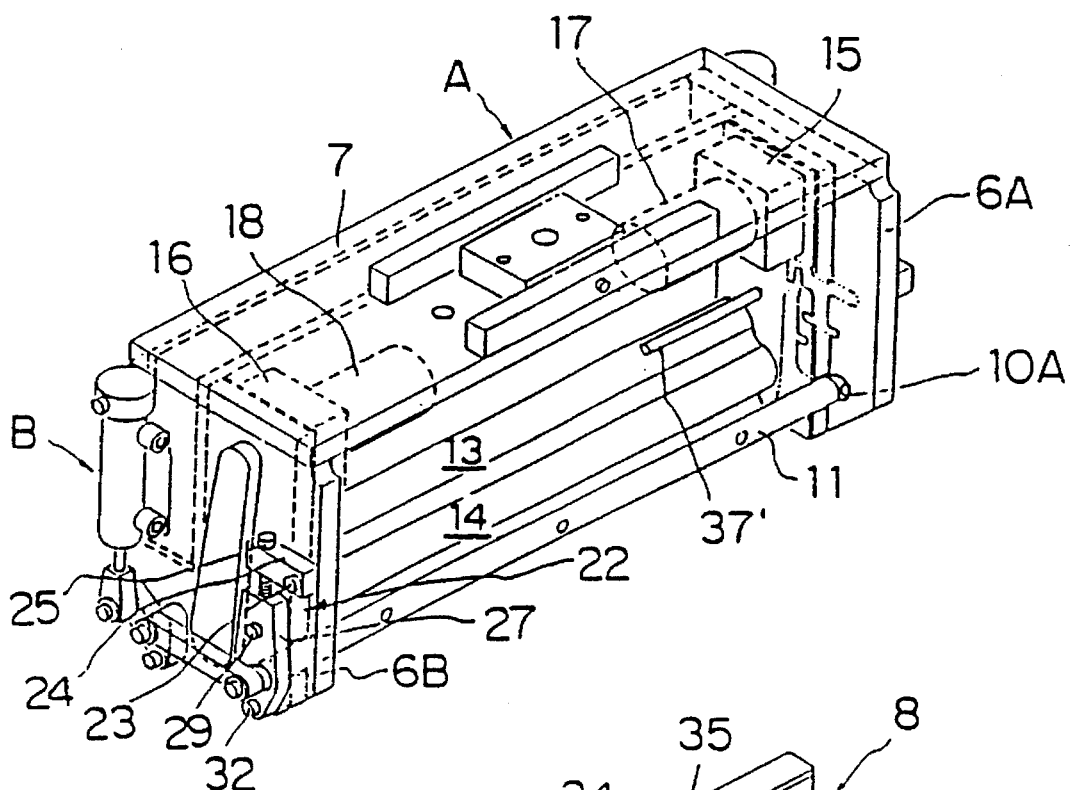
FIG. 4 is a perspective view of the dispenser.
Figure 8:
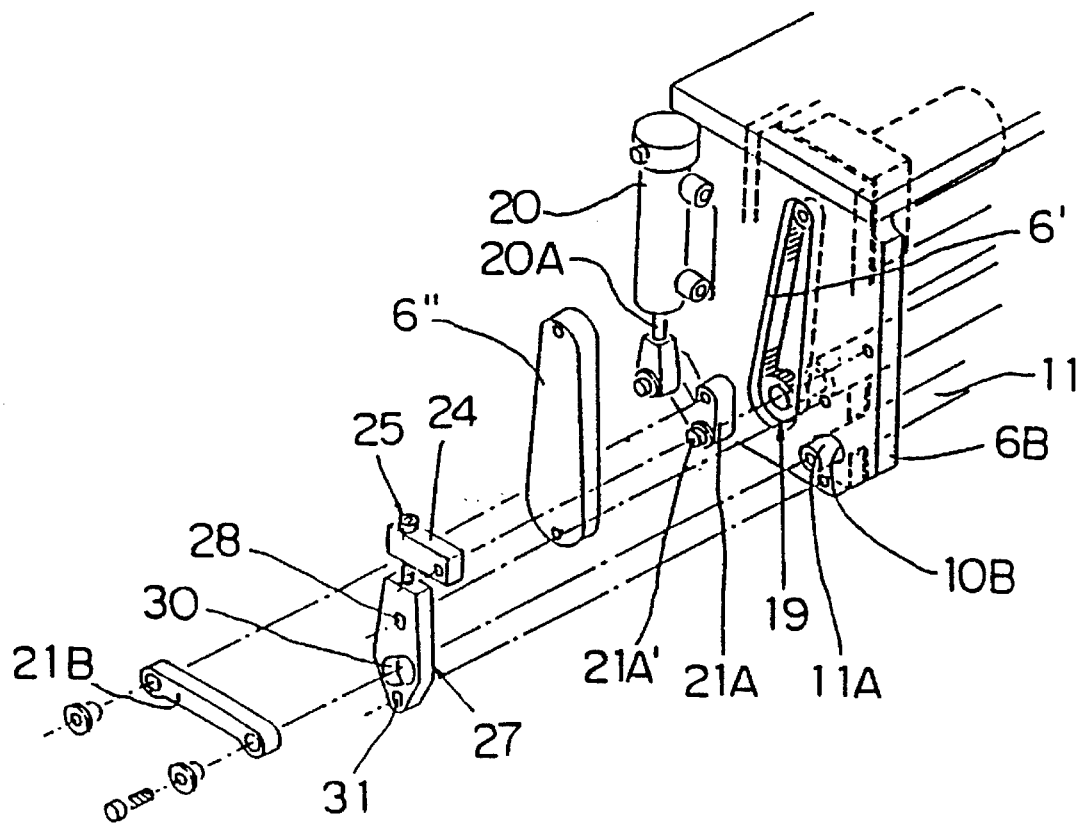
FIG. 8 is an exploded perspective view of a mechanism of a height-adjustable device of the dispenser.
Figure 9:
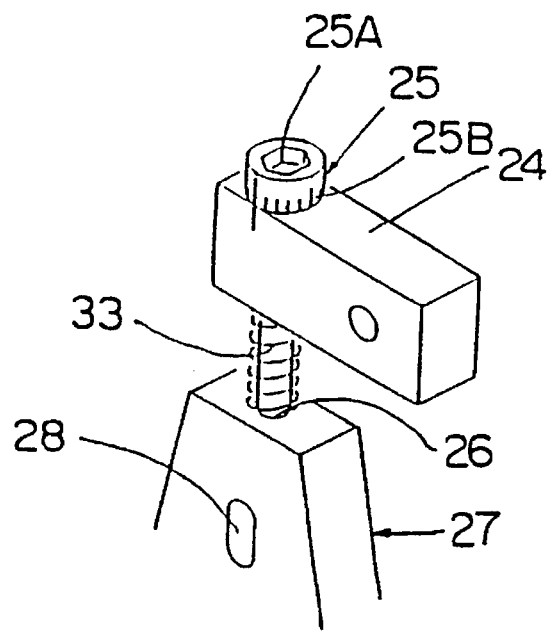
FIG. 9 is an exploded perspective view of a portion of the height-adjustable device.

Indicated by reference numeral 22 is a pair of manually operable height-adjustable devices respectively mounted on the side walls 6A, 6B of housing A and for adjusting the height of the lower flap wall section 8B having the trailing blade 2B as a squeegee blade. Each of the height-adjustable devices 2 comprises, as shown in FIGS. 4, 8 and 9, a rectangular mounting plate 24 horizontally fixed to each of the side walls 6A, 6B by fastening means 23, an adjusting bolt 25 vertically piercing through the mounting plate 24 and a vertically movable adjusting plate 27 having at its upper portion a tapped hole 26 in threaded engagement with said adjusting bolt 25. The adjusting plate 27 has at an upper portion a relatively small slot 28 vertically extending along a vertical axis thereof and at a lower portion a relatively large forwardly and downwardly extending slot 30 which corresponds substantially to the slots 10A, 10B of the side walls 6A, 6B. The opposite end portions 11A of the cylindrical member 11 project respectively outwardly through the slots 10A, 10B. A vertically extending small slot 31 similar to the small slot 28 is also provided in the adjusting plate 27 at a portion below the larger slot 30 and a pin 32 fixed to each side wall 6A, 6B projects outwardly through the lower small slot 31. Coaxially mounted on a threaded portion of the adjusting bolt 25 between the mounting plate 24 and the adjusting plate 27 is a compression spring 33. The head 25A of adjusting bolt 25 is provided, at its peripheral surface, with scale marks 25B which make it possible for the user to easily measure the height of the lower flap wall section 8B by reading them and to help make fine adjustment of the height of the flap wall section 8B.

In manipulation of each of the height-adjustable devices 22, as the adjusting bolt 25 is manually rotated clockwise or counter-clockwise, the adjusting plate 27 which is in threaded engagement therewith is caused to be displaced upwardly or downwardly and the cylindrical member 11 is caused to be moved upwardly or downwardly by the adjusting plate 27 for a distance corresponding generally to the amount of displacement of the adjusting plate 27 along a slope of the slot 10A, 10B in said side wall 6A, 6B, whereby the lower flap wall section 8B secured to the cylindrical member 11 is caused to be generally vertically displaced upwards or downwards for a distance corresponding generally to the amount of displacement of the cylindrical member 11, together with the squeegee blade 2B which is secured to the flap wall section 8B. In the illustrated embodiment, each of the height-adjustable devices 22 is designed so as to be capable of adjusting the height of the flap wall section 8B within the distance of 2.0 mm.

Figure 12:
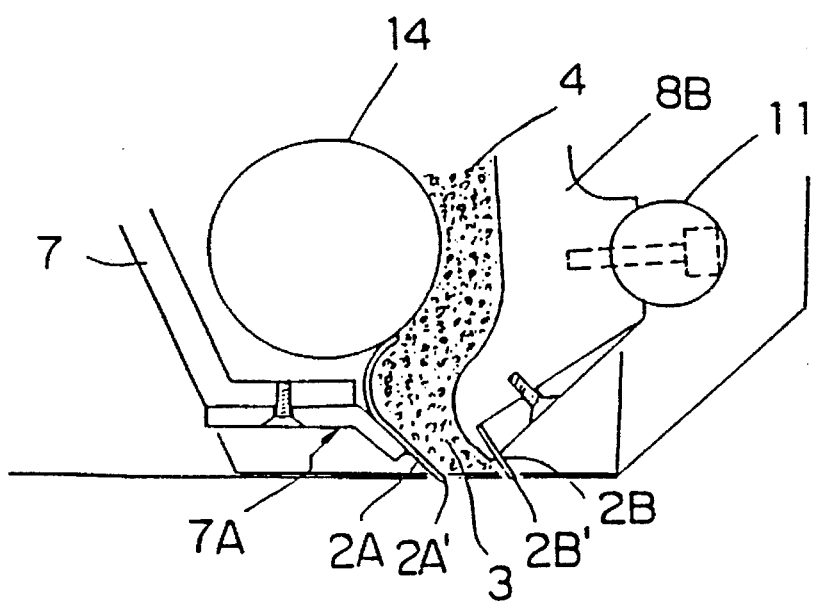
FIG. 12 is a partial vertical cross-sectional view of the dispenser, showing the state in which a bottom aperture of the dispenser is open.
Figure 15:
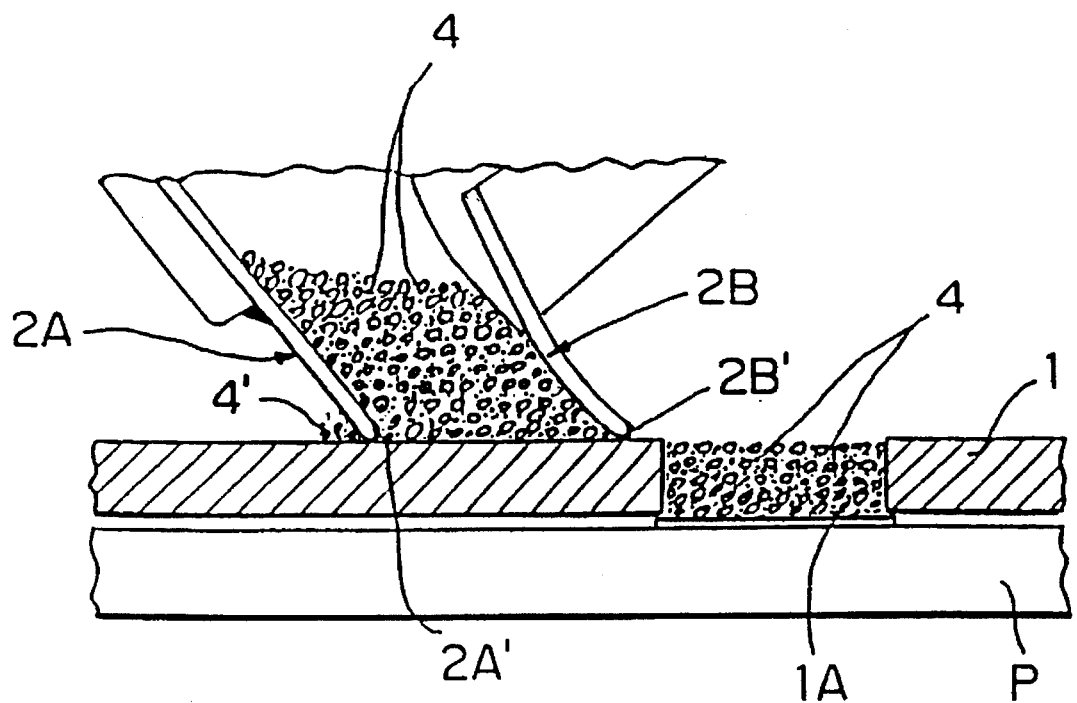
FIG. 15 shows the state in which the dispenser of the present invention is performing printing, while the lower end of the squeegee is pressed against the screen with a relatively strong pressure.

The leading and trailing blades 2A, 2B are preferably made of relatively thin steel plate having excellent rigidity and resiliency, such as carbon steel, alloy steel, etc. which are used as material for making a flat spring. Preferably, thickness of each of the metal blades 2A, 2B is less than 0.5 mm. However, the thickness may be within the range of 0.05 mm to 0.1 mm, as long as such a steel plate as mentioned above is used for making the blades. In the illustrated embodiment, the lower ends 2A', 2B' of the blades 2A, 2B are rounded, as shown in FIGS. 12 and 15, so that when the dispenser S is performing a printing operation, friction produced between the lower ends and the upper surface of the screen 1 can be minimized. When a metal blade is used as a leading blade 2A, it can serve as an effective cleaning blade for removing residue 4' of solder paste 4 left on the upper surface of the screen 1 during the previous pass of the dispenser S.

Indicated by 34 is an opening which pierces through the fixed upper wall section 8A of rear wall 8 for supplying solder paste into the chamber 5 from outside of the dispenser when the amount of the paste 4 remaining in the chamber has been reduced. Indicated by 35 are openings for supplying inert gas into the chamber 5 from the outside of dispenser S for the purpose of preventing the solder paste 4 in the chamber from oxidation.

Indicated by 36 is a partition wall which divides the inner space of the housing A, which is formed by the surrounding walls 6A, 6B, 7, 8 and the top wall 9 mounted thereon, into the chamber 5 and a space 38 for accommodating a device for adjusting temperature of the paste 4 contained in the chamber 5. This temperature adjusting device 37 comprises an electronic heater 37A and an air blower 37B for cooling the paste 4. This blower 37B is arranged to be operated to cool the paste when the temperature thereof exceeds a predetermined range of degrees, such, for example, as 24° to 26° C. in response to a signal of detection sent from a temperature sensor 37' provided in the chamber 5 for detecting the temperature of paste 4 so that the changes in the paste 4 may be held down.

The dispenser S further includes a pair of rotatable members 13, 14 in the form of a cylindrical roller for kneading the paste 4 in the chamber 5 so that the paste 4 can have a desired degree of viscosity for printing. These members 13, 14 extend between the side walls 6A, 6B of the housing A and are arranged to be driven for rotation by means of reversible motors 17, 18 supported by small bushings 15, 16 which are mounted on the inside of the side walls 6A, 6B respectively. In the illustrated embodiment, as shown in FIG. 8, rotation of each motor 17, 18 is transmitted to each of the rotatable members 13, 14 through the medium of a belt drive 19 which is provided within a vertically extending large slot 6' formed in each of the side walls 6A, 6B. The slot 6A' is covered with a removable cover 6".

Figure 10:
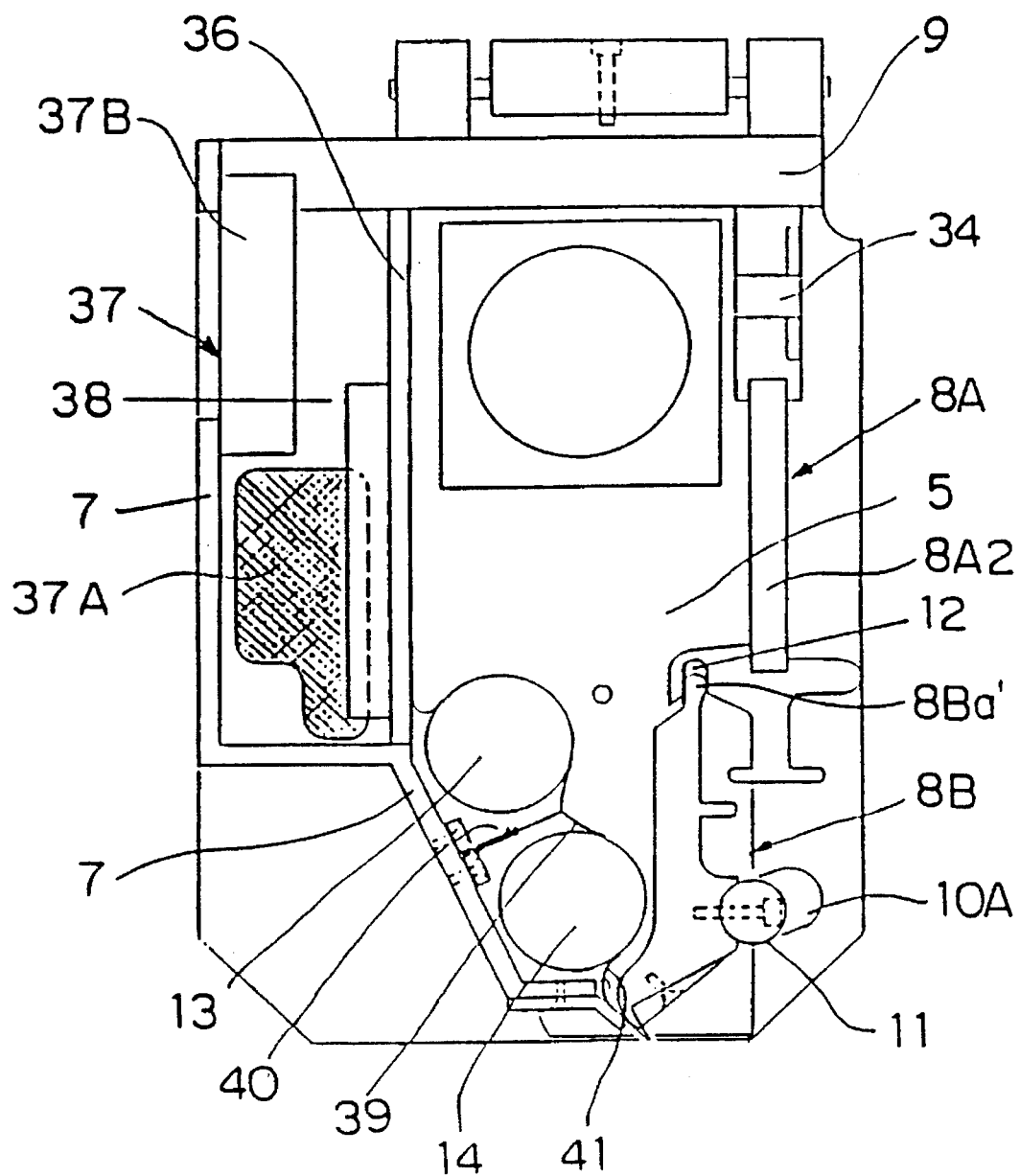
FIG. 10 is a vertical cross-sectional view of the dispenser.
Figure 11:
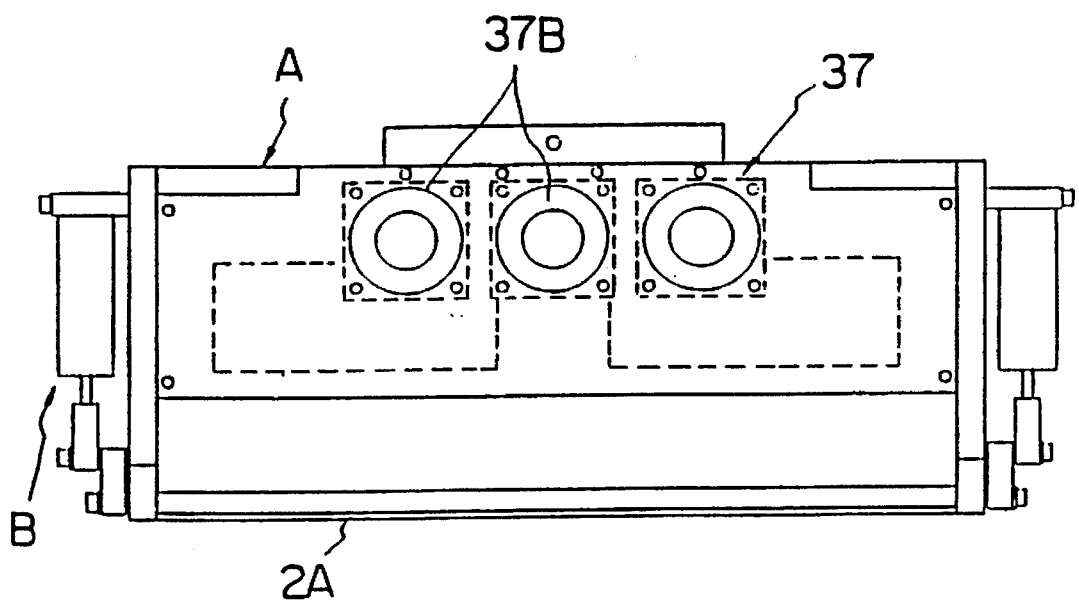
FIG. 11 is a front view of the dispenser.

Indicated by reference numeral 39 in FIG. 10 is a deflecter member made of a flat spring, supported by a supporting member 40 located between the two rollers 13, 14 and resiliently pressed against surfaces thereof on the side facing the lower flap wall section 8B. 41 is also a deflecter member which is integrally formed with the leading metal blade 2A and is resiliently pressed against a surface of the lower roller 14 at a lower portion thereof.

In FIGS. 1 through 3, numeral 43 indicates a pair of supports for supporting screen 1 thereon, 44 indicates a pair of guide rails, 45 is a carriage movably supported by the guide rails, 46 is a pneumatic cylinder mounted on the carriage 45 and for raising and lowering the dispenser S, 47 indicates a belt drive for reciprocating the carriage 45 and the dispenser S along the guide rails 44 and numeral 48 indicates a pair of pneumatic suspension cylinders mounted on the carriage 45 and operatively connected to the dispenser S. These cylinders 48 serve as shock absorbers to absorb the shock to be produced when the dispenser S is lowered and brought into contact with the screen 1 and also serve as balancers for the dispenser S during printing.

In operation, the dispenser S is, when at rest, in an initial position, not shown and from there it is lowered and placed into a second position, not shown to start printing. When the dispenser S is placed into this position, the slit-like bottom aperture 3 is opened by moving the lower flap wall section 8B of rear wall 8 away from the front wall 7 so as to be capable of supplying solder paste 4 contained in the chamber 5 of the dispenser onto the upper surface of screen 1. At the same time, the rollers 13, 14 are made to rotate to knead the paste 4. In this case, it is preferable that the upper roller 13 is made to rotate clockwise, while the lower roller 14 is made to rotate counterclockwise in FIG. 10 so that the paste 4 can be effectively kneaded. The dispenser S is made to travel forwardly, i.e. in the direction of arrow X in FIG. 2, with the lower end 2A', 2B' of the leading and trailing meal blades 2A, 2B being in sliding contact with the upper surface of screen 1. When the dispenser S starts printing, it is desirable that the lower roller 14 is made to rotate clock-wise so that supply of the paste 4 onto the screen 1 can be facilitated. As the squeegee blade 2B passes each of the openings 1A in screen 1, a predetermined amount of the solder paste supplied out of the chamber 5 is applied and urged into the openings 1A by the squeegee blade 2B, whereby the openings 1A are filled with the paste 4. After the squeegee blade 2B has passed all the openings 1A and reached a third position where printing is completed, the aperture 3 is closed, rotation of each roller 13, 14 is stopped and the printed circuit board P is downwardly moved with the printing table 42 so that screen 1 and the circuit board P are separated from each other and printed deposits of solder paste having a pattern corresponding to the pattern of the openings 1A in the screen are left on metalized areas of the board P. After the aperture 3 has been closed, the dispenser S is raised and moved rearwardly, i.e. in the direction of arrow Y in FIG. 3, to return to the initial position from said third position to complete one printing cycle.

It is desirable that after the first printing cycle has been completed, operation of the dispenser S is stopped and the operator checks on the result of the printing performed during the first printing cycle. If the printing effect does not meet requirements or is unsatisfactory and if it has been found that such an undesirable result is due to the fact that the contacting pressure of the lower end 2B' of the squeegee blade 2B against the upper surface of the screen 1 was inadequate or insufficient, then the operator can easily adjust said pressure into a desirable value by manipulation of the pair of height-adjustable devices 22, 22.

Figure 13A:
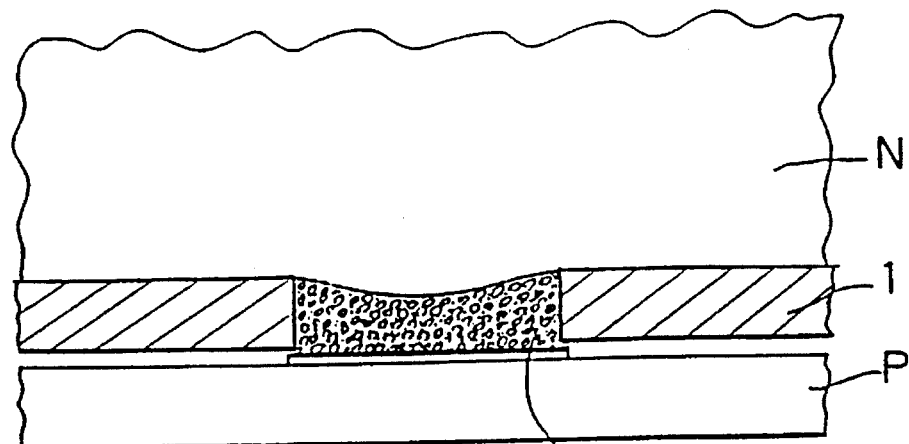
FIG. 13(a) shows the state in which a flexible squeegee employed by conventional screen printing apparatus is in pressure contact with a metal screen.
Figure 13B:
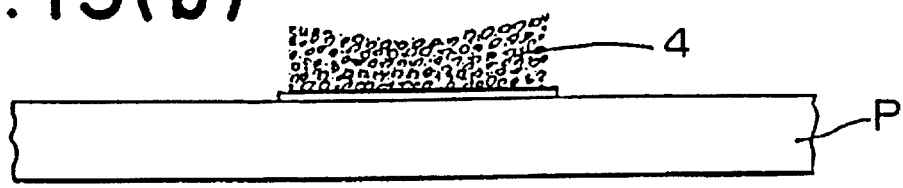
FIG. 13(b) shows the state in which printed solder paste printed by the flexible squeegee is deformed.

Referring to FIG. 13(a), there is depicted the state in which a flexible squeegee N employed by a conventional screen printing apparatus is in pressure contact with a metal screen 1. As shown, the lower end of the squeegee N-projects partially into an opening 1A in the screen 1. As a result, as shown in FIG. 13(b), the printed solder paste 4 on a metalized area of printed circuit board P is deformed such that its upper surface is concaved.

Figure 14A:
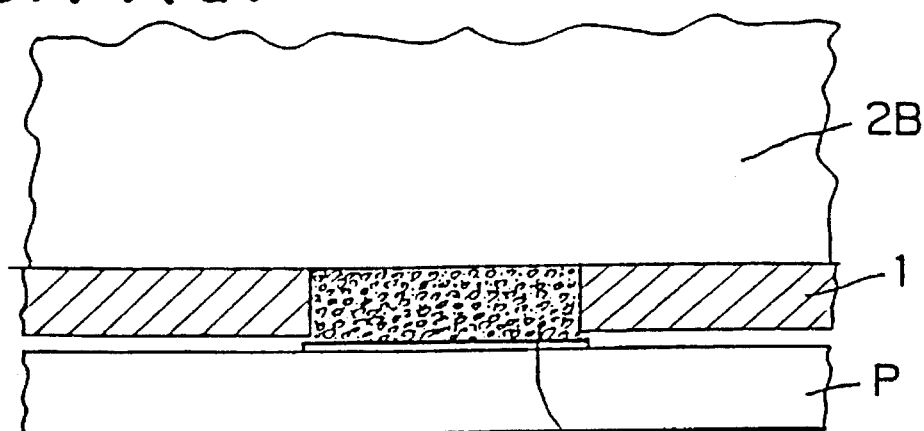
FIG. 14(a) shows the state in which the metal squeegee employed by the present invention is in pressure contact with a metal screen.
Figure 14B:
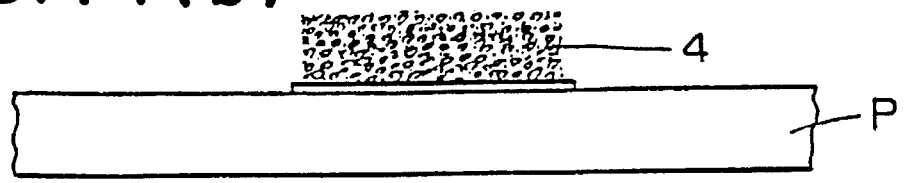
FIG. 14(b) shows the state in which solder paste is properly printed on the circuit board by the metal squeegee.

Referring now to FIG. 14(a), there is shown the state in which the metal squeegee 2B employed by the present invention is in pressure contact with the metal screen 1. It will be seen from the drawing that the metal squeegee blade 2B does not project into an opening 1A in the screen 1 at all. As a result, the thickness of the printed paste 4 is accurately regulated by the thickness of screen 1, as shown in FIG. 14(b).

Referring now to the drawing in FIG. 15, there is shown the state in which the metal squeegee blade 2A employed by the present invention is pressed against the upper surface of screen 1 with relatively strong pressure. It will be seen that the printed paste thickness is still invariant even under such an increased pressure. In this connection, it should be noted that since the lower end 2B' of the squeegee blade 2B is rounded, the blade 2B can be smoothly moved across the screen 1 and also can protect the screen 1 from abrasion.

The surrounding walls 6A, 6B, 7, and the top wall 9 of housing A may be formed of an aluminum alloy or of synthetic resin. The partition wall 36 is preferably formed of brass having excellent thermal conductivity. Both of the leading and trailing blades 2A, 2B may alternatively be formed of a hard material, such as synthetic resin having excellent mechanical strength as well as excellent chemical resistant properties, such for example, as reinforced nylon or the like having a Vickers hardness of more than 10.

It is to be noted that the thickness of the printed film or deposit is determined principally by the thickness of the screen, while dimensions of the same is principally determined by size of opening 1A in the screen and that with a conventional flexible squeegee having a relatively large thickness, it is difficult, in general, to print solder paste with high viscosity through the opening 1A of very small size, say less than 30 micrometers in diameter.

With the dispenser S having the aforementioned height-adjustable devices 22 and the aforementioned blades 2A, 2B, difficulties experienced by the prior art can be effectively overcome. According to the dispenser S of the present invention, the contacting pressure of the squeegee 2B to be applied against the screen 1 can be properly adjusted, if needed depending on the viscous material used and the thickness of the screen as used.

Further, the inside of the dispenser S can be easily cleaned by removing the dismantleable rear wall 8 of housing A.

It is to be understood that the present invention may be embodied in other specific forms without departing from the spirit or essential characteristics of the present invention. The preferred embodiments are therefore to be considered illustrative and not restrictive. The scope of the invention is indicated by the appended claims rather than by the foregoing descriptions and all changes or variations which fall within the meaning and range of the claims are intended to be embraced therein.

I claim:

1. A screen printing apparatus for printing a viscous material onto a surface of a board through the medium of a screen having openings therein and an upper surface, the apparatus comprising:

a viscous material dispenser having a box-like housing having a chamber, a slit-like bottom aperture and a rear wall;

said chamber containing said viscous material;

said slit-like bottom aperture having a leading side and a trailing side opposed thereto;

a pair of blades including a leading blade and a trailing blade, said pair of blades depending from the housing on substantially opposite sides of said bottom aperture to contact said upper surface of said screen;

said rear wall of said housing comprising a fixed upper wall section and a lower flap wall section swingably and slidably connected thereto, depending therefrom and defining the trailing side of the bottom aperture;

said trailing blade serving as a squeegee blade and fixed to said flap wall section;

a pair of manually operable height-adjustable devices mounted on said housing, said flap wall being connected to said height-adjustable devices, whereby the contacting pressure of the lower end of said trailing blade to be applied against said upper surface of said screen can be adjusted as desired; and a pair of actuating means mounted on said housing and for closing said aperture when said dispenser is in a non-printing position and for opening it to supply a predetermined amount of the material in said chamber onto the screen through said aperture when said dispenser is in a printing position, said flap wall section being operatively engaged with said actuating means.

2. A screen printing apparatus as claimed in claim 1, wherein the viscous material is a solder paste to be printed onto a printed circuit board to mount semi-conductor tips and/or other electronic parts thereon.

3. A screen printing apparatus as claimed in claim 1, wherein:

a rotatable member for kneading the viscous material is contained in the chamber.

4. A screen printing apparatus as claimed in claim 2, wherein the housing is a closed type and includes another chamber for accommodating a temperature adjusting means for adjusting a temperature of the solder paste contained in said chamber by means of a partition wall.

5. A screen printing apparatus as claimed in claim 1, wherein each of the pair of the blades is formed of a steel strip and a lower end of each of the blades is rounded.

6. A screen printing apparatus as claimed in claim 5, wherein a thickness of each of said blades is less than 0.5 mm.

7. A screen printing apparatus as claimed in claim 1, wherein the screen is formed of a stainless steel.

8. A screen printing apparatus as claimed in claim 1, wherein the dispenser is connected to a carriage which is movably supported by a pair of guide rails by means of a pneumatic cylinder for raising and lowering the dispenser and a pair of pneumatic suspension cylinders.

9. A screen printing apparatus as claimed in claim 1, wherein each of the pair of the actuating means includes a pneumatic actuator and a link mechanism which drivingly connects the actuator to the lower flap wall section of said rear wall.

10. A screen printing apparatus as claimed in claim 1, wherein said leading blade serves, in each pass of the dispenser as a scraper blade for scraping off residue of the viscous material and for the removal of the residue adhered to the upper surface of said screen during a previous pass of said dispenser.

\* \* \* \* \*